United States Patent
Zhang et al.

(10) Patent No.: US 8,064,195 B2
(45) Date of Patent: Nov. 22, 2011

(54) STORAGE DEVICE MODULE AND SCREW MOUNTING STRUCTURE OF THE SAME

(75) Inventors: Guang-Yi Zhang, Shenzhen (CN); Zhe Zhang, Shenzhen (CN); Bing-Bao Guo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 101 days.

(21) Appl. No.: 12/612,593

(22) Filed: Nov. 4, 2009

(65) Prior Publication Data

US 2011/0051350 A1 Mar. 3, 2011

(30) Foreign Application Priority Data

Aug. 28, 2009 (CN) .......................... 2009 1 0306230

(51) Int. Cl.
*G06F 1/16* (2006.01)
*A47B 81/00* (2006.01)
*A47F 7/00* (2006.01)
*F16B 37/04* (2006.01)
*F16B 41/00* (2006.01)
*E05C 5/04* (2006.01)

(52) U.S. Cl. ........... 361/679.33; 361/679.31; 312/223.2; 211/26; 403/21; 292/251; 70/232

(58) Field of Classification Search .......... 361/679.01–679.45, 679.55–679.59, 361/724–727; 312/223.1, 223.2; 211/26; 70/232, DIG. 57; 292/251; 403/21, 22; 411/999
See application file for complete search history.

(56) References Cited

U.S. PATENT DOCUMENTS

| | | | | |
|---|---|---|---|---|
| 4,640,524 A | * | 2/1987 | Sedlmair | 280/611 |
| 5,380,031 A | * | 1/1995 | Vitali et al. | 280/611 |
| 6,556,434 B1 | * | 4/2003 | Chan et al. | 361/679.33 |
| 6,621,696 B1 | * | 9/2003 | Wang | 361/679.33 |
| 6,667,880 B2 | * | 12/2003 | Liu et al. | 361/679.35 |
| 6,813,148 B2 | * | 11/2004 | Hsu et al. | 361/679.39 |
| 7,611,100 B2 | * | 11/2009 | Peng et al. | 248/27.1 |
| 2007/0119793 A1 | * | 5/2007 | Peng et al. | 211/26 |

* cited by examiner

*Primary Examiner* — Jayprakash N Gandhi
*Assistant Examiner* — Nidhi Desai
(74) *Attorney, Agent, or Firm* — Altis Law Group, Inc.

(57) ABSTRACT

A storage device module is disclosed. The storage device module includes a storage device, a bracket for receiving the storage device, a mounting member attached to one side of the bracket, and a screw attached to the mounting member for extending through the bracket to screw into the storage device. A screw mounting structure is arranged on the mounting member for retaining the screw.

17 Claims, 7 Drawing Sheets

STORAGE DEVICE MODULE AND SCREW MOUNTING STRUCTURE OF THE SAME

BACKGROUND

1. Technical Field

The present invention relates to storage device modules and, more particularly, to a data storage device module with a screw mounting structure.

2. Description of Related Art

An electronic apparatus, such as a desktop computer, tower computer, server, or the like, usually includes storage devices, such as hard disk drives, compact disk read-only memory (CD-ROM) drives, digital video disc (DVD) drives, floppy disk drives, and the like. These storage devices are typically added to increase the functionality of the electronic apparatus as desired by a user.

The installation of a hard disk drive in a computer typically involves the use of screws to attach the hard disk drive to a bracket to form a storage device module, which is extractably mounted in a computer chassis. However, the screws of the storage device module are easily lost.

DETAILED DESCRIPTION

Figure 1:
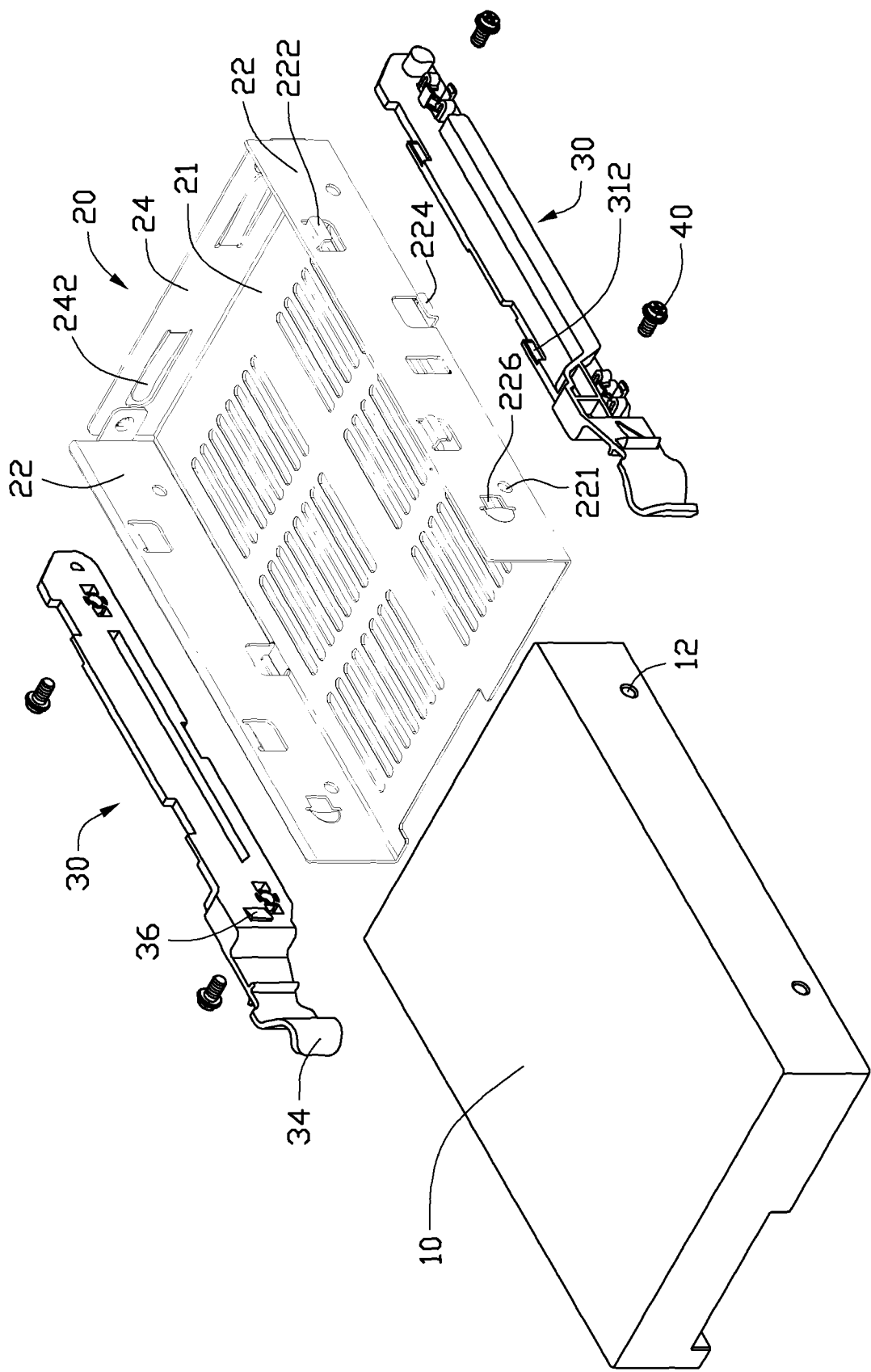
FIG. 1 is an exploded, isometric view of an exemplary embodiment of a storage device module, the storage device module includes a bracket, a storage device, two mounting members and a plurality of screws.

Referring to FIG. 1, an exemplary embodiment of a storage device module includes a storage device 10, a bracket 20 for receiving the storage device 10, two mounting members 30 attached to opposite sides of the bracket 20 respectively, and a plurality of screws 40. A plurality of mounting holes 12 is defined in opposite sides of the storage device 10.

The bracket 20 includes a bottom wall 21, two sidewalls 22 perpendicularly extending up from opposite sides of the bottom wall 21, and an end wall 24 perpendicularly extending up from one end of the bottom wall 21 and connecting to the sidewalls 22. The sidewalls 22 are parallel to each other. A plurality of long slots is defined in the bottom wall 21 for heat dissipating. Each sidewall 22 defines a plurality of through holes 221 corresponding to the mounting holes 12 of the storage device 10. Two L-shaped first locating tabs 222 extend from an upper portion of an outer surface of each sidewall 222 towards a lower portion of the outer surface of the sidewall 222. An L-shaped second locating tab 224 extends from the lower portion of the outer surface of each sidewall 22 toward the upper portion. A locating block 226 is formed on the outer surface of each sidewall 22, away from the end wall 24. A plurality of tongue-shaped resilient pieces 242 extend from the end wall 24, for shock absorption of the storage device 10.

Figure 2:
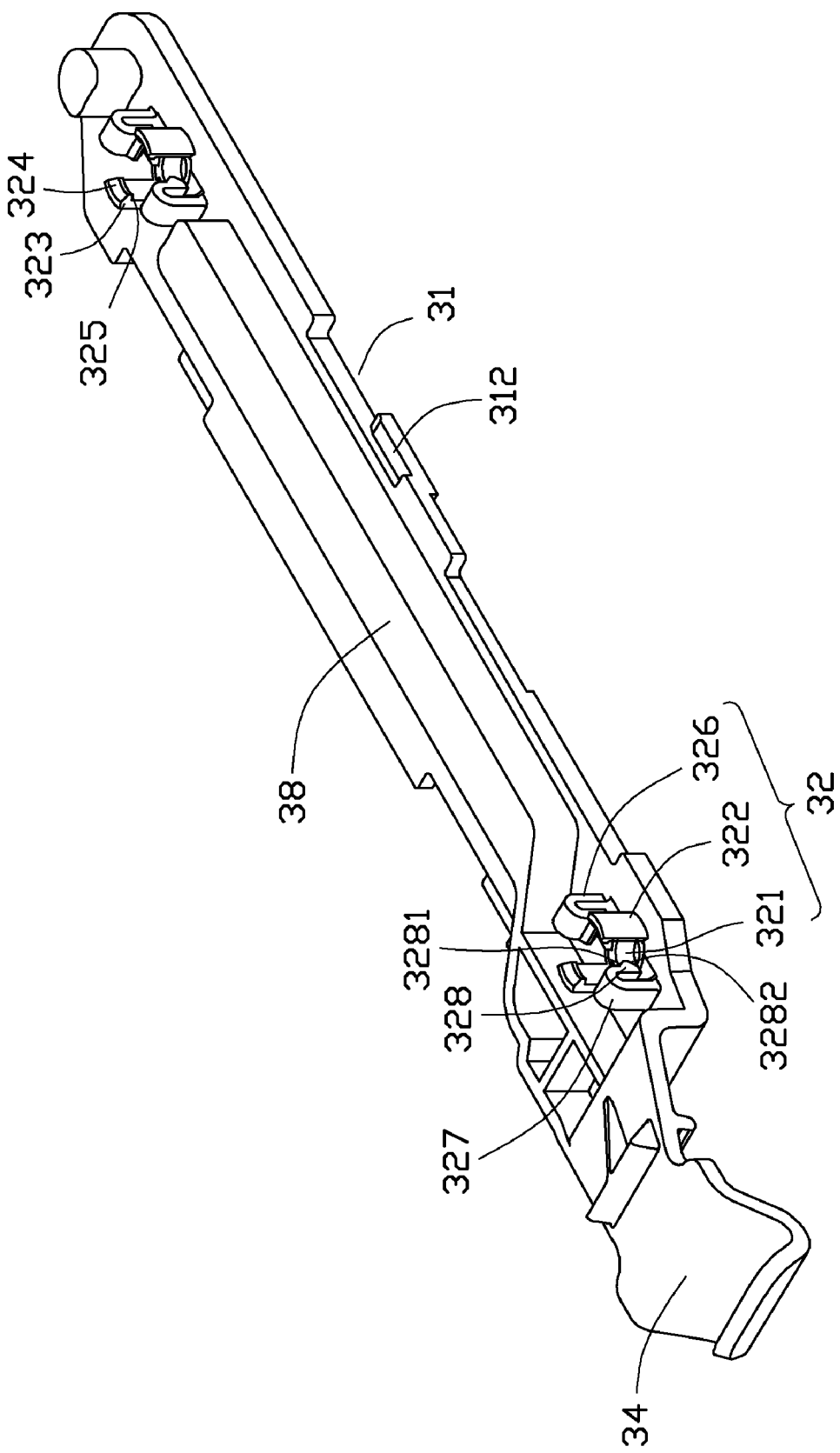
FIG. 2 is an enlarged view of one of the mounting members of FIG. 1, but viewed from another perspective.

Referring to FIG. 2, each mounting member 30 is a generally long plate. A plurality of cutouts 31 are defined in opposite sides of the mounting member 30, corresponding to the first and second locating tabs 222 and 224. A protrusion 312 extends into each cutout 31 from an edge bounding the cutout 31. A plurality of screw mounting structures 32 is arranged on an outer surface of each mounting member 30, opposite to the bracket 20. Each screw mounting structure 32 defines a through hole 321, corresponding to one of the through holes 221 of the bracket 20. The screw mounting structure 32 includes two hooks 322 perpendicularly extend from the outer surface of the mounting member 30 and opposite to each other across the through hole 321, and two retainers 326 perpendicularly extend from the outer surface of the mounting member 30 and opposite to each other around the through hole 321. The hooks 322 and the retainers 326 are alternately arranged around the through hole 321. A wedge-shaped protuberance 323 extends from a top portion of each hook 322. The protuberance 323 includes a slanting guiding surface 324 opposite to the mounting member 30 and a stop surface 325 facing the mounting member 30. Each retainer 326 is generally J-shaped and includes a main body (not labeled) extending from the mounting member 30, a resilient portion 327 bent towards the other retainer 326 from a distal end of the main body, and a wedge 328 protruding from a distal end of the resilient portion 327 and facing the other retainer 326. The wedge 328 includes a first inclined surface 3281 opposite to the mounting member 30 and a second inclined surface 3282 facing the mounting member 30. A distance between the protuberance 323 and the outer surface of the mounting member 30 is greater than a distance between the wedge 328 and the outer surface of the mounting member 30, for receiving a head of one of the screws 40 between the wedge 328 and the protuberance 323. A plurality of ribs 38 extend from the outer surface of the mounting member 30. The plurality of ribs 38 are taller than the hooks 322 and the retainers 326 of the screw mounting structure 32, for protecting the screw mounting structure 32 from being damaged. An operating portion 34 is formed from one end of the mounting member 30. A wedge-shaped block 36 (shown in FIG. 1) extends from an end of an inner surface of the mounting member 30, facing the bracket 20.

Figure 3:
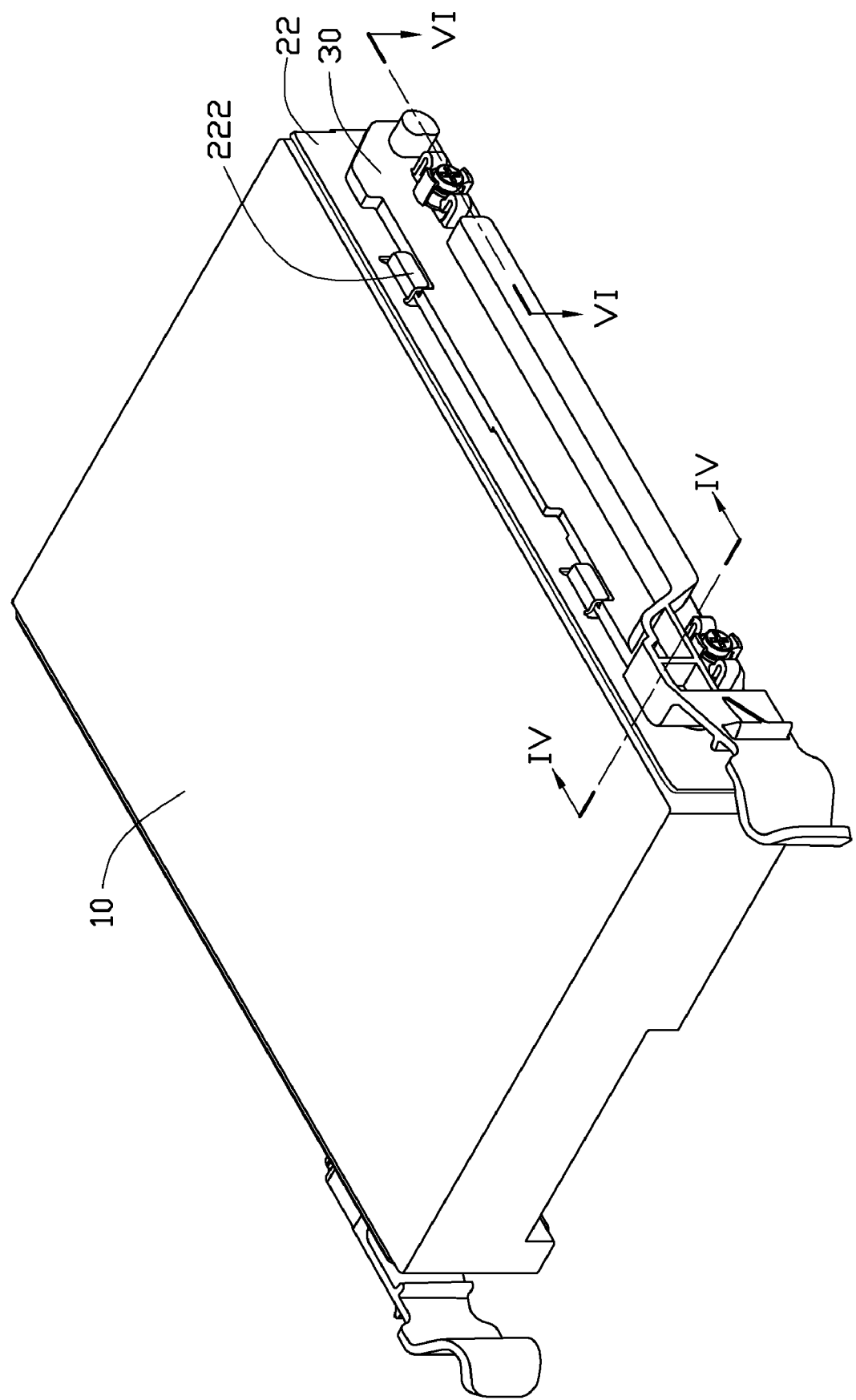
FIG. 3 is an assembled view of the storage device module of FIG. 1.
Figure 4:
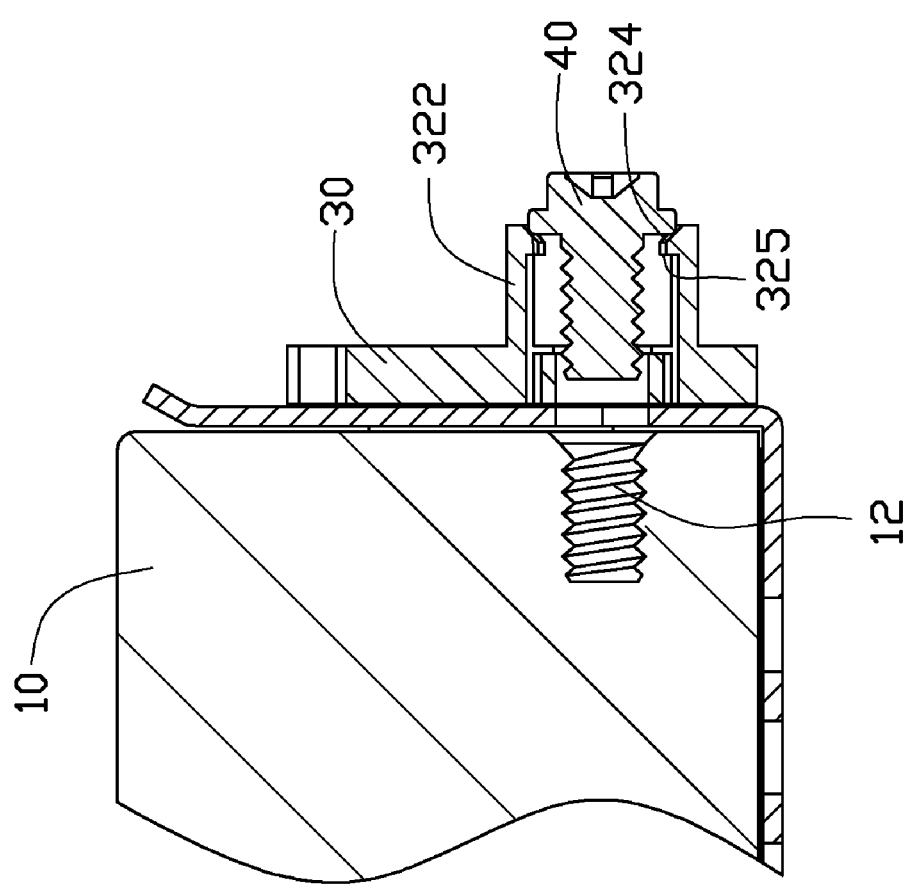
FIGS. 4 and 5 are cross-sectional views of FIG. 3, taken along the line of IV-IV, but showing different using states.
Figure 5:
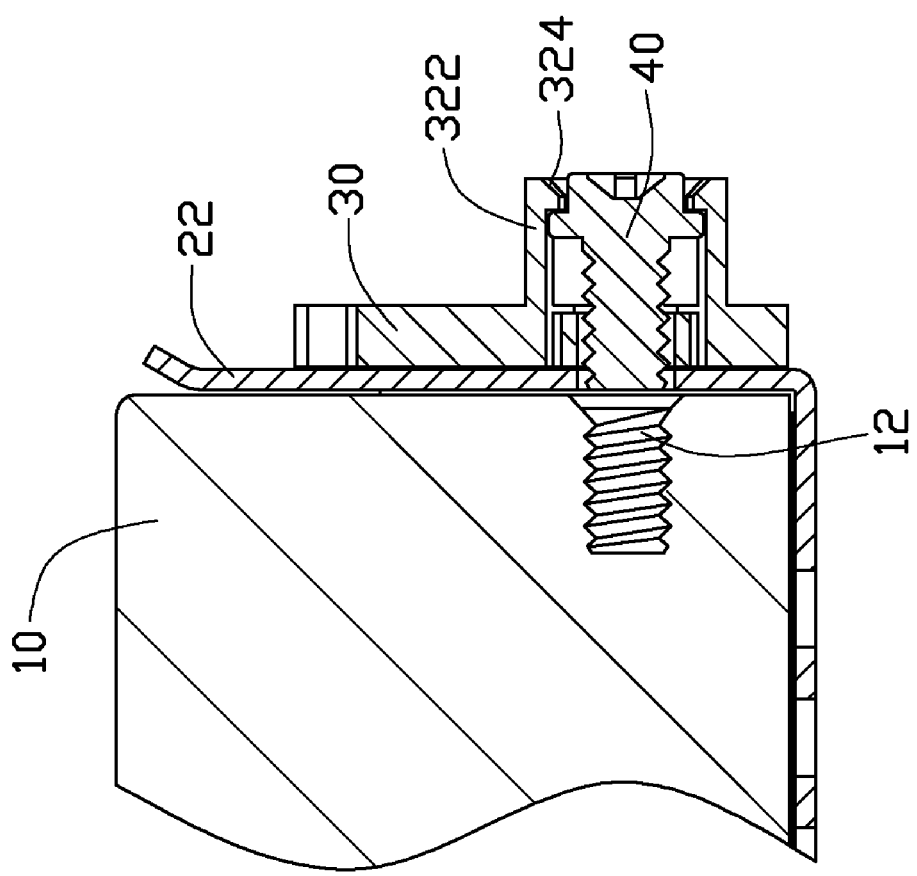
Figure 6:
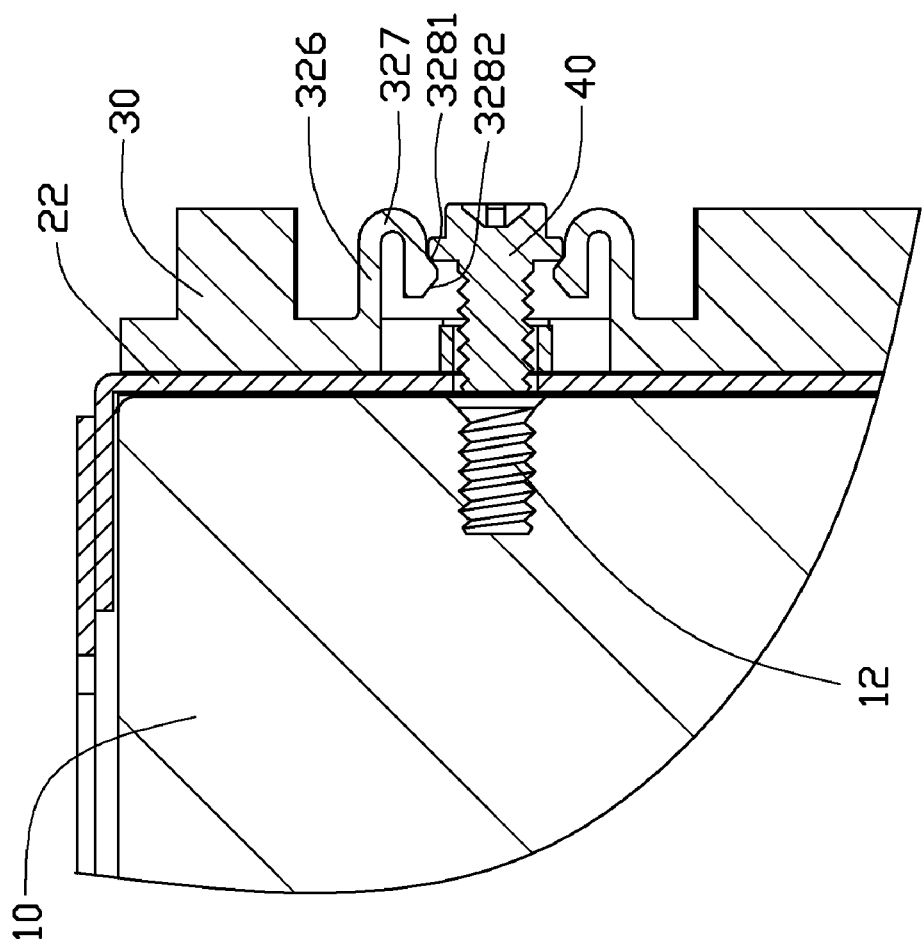
FIGS. 6 and 7 are cross-sectional views of FIG. 3, taken along the line of VI-VI, but showing different using states.
Figure 7:
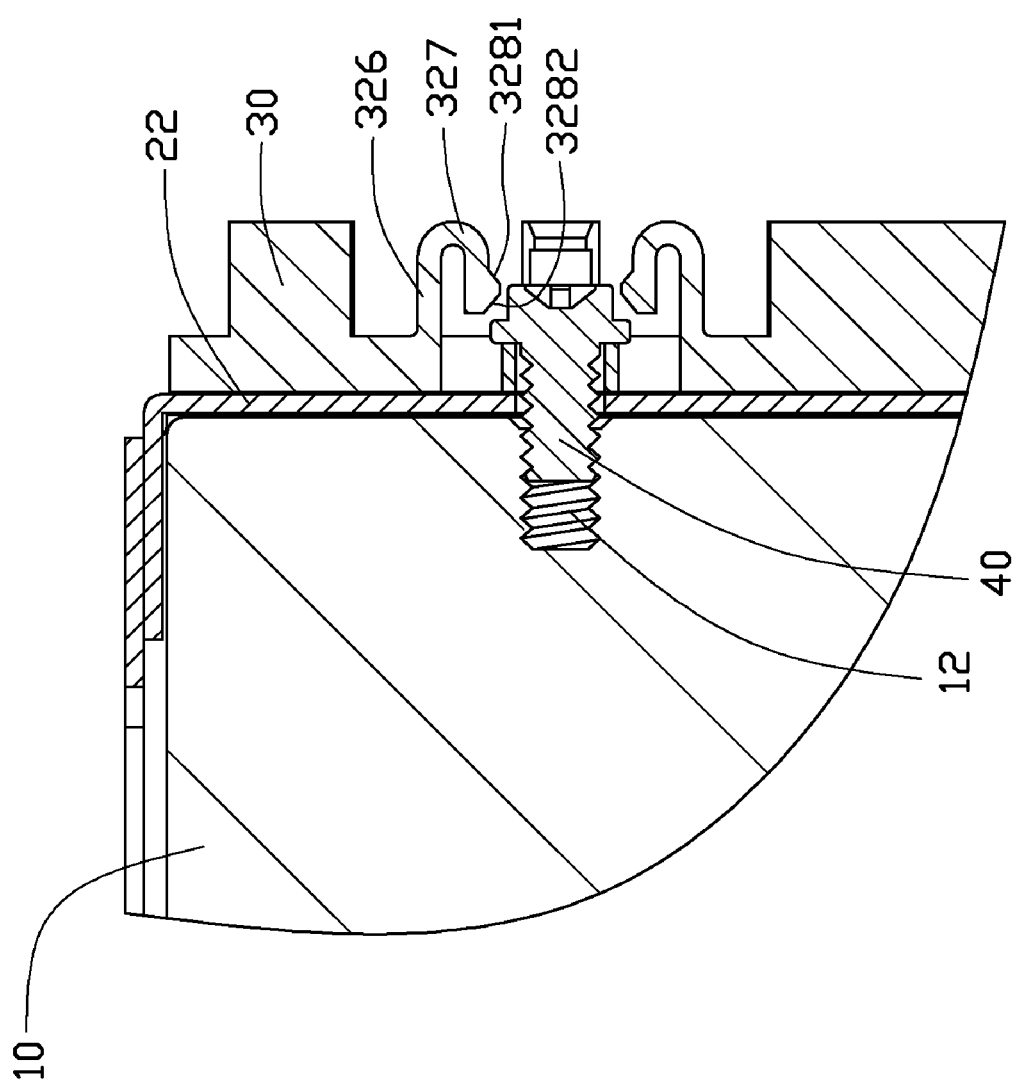

Referring to FIG. 3, in assembly, each mounting member 30 is in tight contact one of the sidewalls 22 of the bracket 20, with the cutouts 31 of the mounting member 30 aligning with the first and second locating tabs 222 and 224. The mounting member 30 is slid towards the end wall 24 of the bracket 20, until the protrusions 312 of the mounting member 30 are located under and engage with the corresponding locating pieces 222 and 224. The mounting members 30 are attached to the sidewalls 22 of the bracket 20. The wedge-shaped blocks 36 of the mounting members 30 engage with the locating blocks 226 of the bracket 20.

Referring to FIGS. 4 to 7, the head of each screw 40 resists against the guiding surfaces 324 of the hooks 322 to deform the hooks 322, allowing the head of the screw 40 riding over the protuberances 323. The head of the screw 40 is located between the stop surfaces 325 of the hooks 322 and the wedges 328 of the retainers 326. The screw portion of the screw 40 extends through the through hole 321 of the mounting member 30. Therefore, the screw 40 cannot disengage from the screw mounting structure 32 freely.

To mount the storage device 100 the bracket 20, the storage device 10 is received in the bracket 20 with the mounting holes 12 of the storage device 10 aligning with the through holes 221 of the bracket 20. The head of each screw 40 is rotated to press the first inclined surface 3281 to deform the resilient portion 327, for the head of the screw 40 riding over the wedge 328, therefore, the screw portion of the screw 40 passes through the through hole 321 of the mounting member 30 and the through hole 221 of the bracket 20 to screw into the corresponding mounting hole 12 of the storage device 10. As a result, the storage device 10 is mounted to the bracket 20. The head of the screw 40 is received between the wedge 328 of the retainer 326 and the outer surface of the mounting member 30.

To detach the storage device module 10 from the bracket 20, the head of each screw 40 is rotated reversely. The head of the screw 40 presses the second inclined surfaces 3282 to deform the resilient portions 327, for the head of the screw 40 riding over the wedge 328 to be received between the stop surfaces 325 of the hooks 322 and the wedges 328 of the retainers 326. The screw portion of the screw 40 disengages from the corresponding mounting hole 12 of the storage device 10. Therefore the storage device 10 can be drawn out from the bracket 20.

While several embodiments have been disclosed, it is understood that any element disclosed in any one embodiment is easily adapted to other embodiments. It is also to be understood, however, that even though numerous characteristics and advantages of the disclosure have been set forth in the foregoing description, together with details of the structure and function of the invention, the disclosure is illustrative only, and changes may be made in details, especially in matters of shape, size, and arrangement of parts within the principles of the invention to the full extent indicated by the broad general meaning of the terms in which the appended claims are expressed.

What is claimed is:

1. A storage device module, comprising:
   a storage device defining a mounting hole;
   a bracket for receiving the storage device, the bracket defining a first through hole corresponding to the mounting hole of the storage device;
   a mounting member attached to the bracket, wherein the mounting member defines a second through hole corresponding to the first through hole of the bracket, two hooks extend from an outer surface opposite to the bracket of the mounting member across the second through hole of the mounting member and opposite to each other, two retainers extend from the outer surface of the mounting member across the second through hole of the mounting member and opposite to each other, a protuberance extends from a distal end of each of the hooks, and each of the retainers forms a wedge; and
   a screw comprising a head and a screw portion, wherein the screw portion is capable of extending through the second through hole of the mounting member and the first through hole of the bracket to screw into the mounting hole of the storage device, and the head of the screw is capable of being located between the protuberances of the hooks and the wedges of the retainers;
   wherein the bracket comprises a sidewall, the first through hole is defined in the sidewall, a plurality of L-shaped locating tabs extend from an outer surface of the sidewall of the bracket, a plurality of cutouts are defined in opposite sides of the mounting member corresponding to the locating tabs, a plurality of protrusions extend into each cutout from an edge bounding the cutout, and the plurality of protrusions is located under and engaged with the corresponding locating tabs.

2. The storage device module of claim 1, wherein the hooks and the retainers are alternately arranged around the second through hole.

3. The storage device module of claim 1, wherein the protuberance of each of the hooks comprises a guiding surface opposite to the second through hole and a stop surface facing the second through hole, and the head of the screw is operable to press the guiding surface to deform the hook, for the head of the screw to ride over the protuberance.

4. The storage device module of claim 1, wherein each of the retainers is generally J-shaped and comprises a resilient portion connecting the wedge.

5. The storage device module of claim 4, wherein the wedge of each of the retainers comprises a first inclined surface opposite to the second through hole and a second inclined surface facing the second through hole, and the head of the screw is operable to be rotated to press the first inclined surface to deform the resilient portion, for the head of the screw to ride over the wedge to extend the screw portion of the screw through the second through hole of the mounting member and the first through hole of the bracket to screw into the mounting hole of the storage device.

6. The storage device module of claim 5, wherein the protuberance of each of the hooks comprises a stop surface facing the mounting member, and the head of each of the screws is operable to press the second inclined surfaces to deform the resilient portions, for the head of each of the screws to ride over the wedge to be received between the stop surfaces of the hooks and the wedges of the retainers.

7. The storage device module of claim 1, wherein a distance between the protuberance and the outer surface of the mounting member is greater than a distance between the wedge and the outer surface of the mounting member, for receiving the head of the screw between the wedge and the protuberance.

8. The storage device module of claim 1, wherein a plurality of ribs extends from the outer surface of the mounting member, and the plurality of ribs are taller than the hooks and the retainers.

9. The storage device module of claim 1, wherein a wedge-shaped block extends from an inner surface facing the bracket of the mounting member, and a locating block is formed on the outer surface of the sidewall of the bracket, to engage with the wedge-shaped block.

10. The storage device module of claim 1, wherein the bracket comprises an end wall, and a plurality of tongue-shaped resilient pieces extending from the end wall, for shock absorption of the storage device.

11. A storage device module, comprising:
    a storage device;
    a bracket for receiving the storage device;
    a mounting member attached to the bracket, the mounting member defining a through hole and comprising:
    two hooks extending from one side of the mounting member and opposite to each other across the through hole of the mounting member, a protuberance extending from a distal end of each of the hooks;
    two retainers extending from the side of the mounting member and opposite to each other across the through hole of the mounting member, each of the retainers forming a wedge; and
    a screw comprising a head and a screw portion, wherein the screw portion is capable of extending through the through hole of the mounting member such that the head of the screw is located between the protuberances of the hooks and the wedges of the retainers;
    wherein the bracket comprises a sidewall, a first through hole is defined in the sidewall, a plurality of L-shaped locating tabs extend from an outer surface of the sidewall of the bracket, a plurality of cutouts are defined in opposite sides of the mounting member corresponding to the locating tabs, a plurality of protrusions extend into each cutout from an edge bounding the cutout, and the plurality of protrusions is located under and engaged with the corresponding locating tabs.

12. The storage device module of claim 11, wherein the hooks and the retainers are alternately arranged around the through hole of the mounting member.

13. The storage device module of claim 11, wherein the protuberance comprises a guiding surface of each of the hooks opposite to the through hole and a stop surface facing the through hole, and the head of the screw is operable to press the guiding surface to deform the hook for the head of the screw to ride over the protuberance.

14. The storage device module of claim 11, wherein each of the retainers is generally J-shaped and comprises a resilient portion connecting the wedge.

15. The storage device module of claim 14, wherein the wedge of each of the retainers comprises a first inclined surface opposite to the second through hole and a second inclined surface facing the second through hole, and the head of the screw is operable to be rotated to press the first inclined surface to deform the resilient portion, for the head of the screw to ride over the wedge to extend the screw portion of the screw through the second through hole of the mounting member and the first through hole of the bracket to screw into the mounting hole of the storage device.

16. The storage device module of claim 15, wherein the protuberance of each of the hooks comprises a stop surface facing the mounting member, and the head of each of the screws is operable to press the second inclined surfaces to deform the resilient portions, for the head of each of the screws to ride over the wedge to be received between the stop surfaces of the hooks and the wedges of the retainers.

17. The storage device module of claim 11, wherein a distance between the protuberance and the side of the mounting member is greater than a distance between the wedge and the side of the mounting member, for receiving the head of the screw between the wedge and the protuberance.

* * * * *